US011267695B2

(12) United States Patent
Deas et al.

(10) Patent No.: US 11,267,695 B2
(45) Date of Patent: Mar. 8, 2022

(54) MEMS DEVICE

(71) Applicant: Cirrus Logic International Semiconductor Ltd., Edinburgh (GB)

(72) Inventors: James Thomas Deas, Edinburgh (GB); Colin Wei Hong Chung, Edinburgh (GB); Marek Sebastian Piechocinski, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 173 days.

(21) Appl. No.: 16/603,740

(22) PCT Filed: Apr. 12, 2018

(86) PCT No.: PCT/GB2018/050977
§ 371 (c)(1),
(2) Date: Oct. 8, 2019

(87) PCT Pub. No.: WO2018/189547
PCT Pub. Date: Oct. 18, 2018

(65) Prior Publication Data
US 2020/0055726 A1     Feb. 20, 2020

Related U.S. Application Data

(60) Provisional application No. 62/485,226, filed on Apr. 13, 2017.

(30) Foreign Application Priority Data

Apr. 26, 2017   (GB) ..................................... 1706637

(51) Int. Cl.
    *H04R 1/04*       (2006.01)
    *B81B 3/00*       (2006.01)
(Continued)

(52) U.S. Cl.
    CPC .......... *B81B 3/0081* (2013.01); *B81C 1/0069* (2013.01); *H04R 1/04* (2013.01);
(Continued)

(58) Field of Classification Search
    CPC ........................ B81C 3/0081; B81C 1/0069
(Continued)

(56) References Cited

U.S. PATENT DOCUMENTS

2008/0310663 A1   12/2008   Shirasaka et al.
2010/0027830 A1   2/2010   Hsu et al.
(Continued)

FOREIGN PATENT DOCUMENTS

CN     102771142 A     11/2012
CN     104062462 A     9/2014
(Continued)

OTHER PUBLICATIONS

International Search Report and Written Opinion of the International Searching Authority, International Application No. PCT/GB2018/050977, dated Sep. 10, 2018.
(Continued)

*Primary Examiner* — Elias Ullah
(74) *Attorney, Agent, or Firm* — Jackson Walker L.L.P.

(57) ABSTRACT

Micro-electro-mechanical system (MEMS) devices are disclosed, including a MEMS device comprising a semiconductor die including integrated circuitry, a structure mounted on the semiconductor die and covering at least a portion of the circuitry, the structure defining a space between the structure and the at least a portion of the circuitry, and a transducer including a membrane, the transducer located outside of the space.

20 Claims, 7 Drawing Sheets

(51) Int. Cl.
*B81C 1/00* (2006.01)
*H04R 19/00* (2006.01)
*H04R 19/04* (2006.01)

(52) U.S. Cl.
CPC ........... *H04R 19/005* (2013.01); *H04R 19/04* (2013.01); *B81B 2201/0257* (2013.01); *B81B 2201/0264* (2013.01); *B81B 2203/0127* (2013.01); *B81B 2207/015* (2013.01); *H04R 2201/003* (2013.01); *H04R 2410/03* (2013.01)

(58) Field of Classification Search
USPC ....................................................... 257/419
See application file for complete search history.

(56) References Cited

U.S. PATENT DOCUMENTS

| | | |
|---|---|---|
| 2013/0320465 A1 | 12/2013 | Huang et al. |
| 2013/0343590 A1 | 12/2013 | Nakagawa et al. |
| 2014/0254851 A1 | 9/2014 | Chen |
| 2017/0064458 A1 | 3/2017 | Chen et al. |

FOREIGN PATENT DOCUMENTS

| | | |
|---|---|---|
| CN | 103733304 B | 8/2016 |
| CN | 106535071 A | 3/2017 |
| GB | 2529134 A | 2/2016 |
| WO | 2010092399 A2 | 8/2010 |
| WO | 2016016648 A1 | 2/2016 |

OTHER PUBLICATIONS

Combined Search and Examination Report under Sections 17 and 18(3), UKIPO, Application No. GB1706637.4, dated Oct. 26, 2017.
Search Report, Taiwanese Patent Application No. 107112784, dated Aug. 16, 2021.
Office Action, Taiwanese Patent Application No. 107112784, dated Dec. 8, 2021.
Office Action (English Translation), Taiwanese Patent Application No. 107112784, dated Dec. 8, 2021.

MEMS DEVICE

The present application is a 371 of International Patent Application No. PCT/GB2018/050977, filed Apr. 12, 2018, which claims priority to U.S. Provisional Patent Application Ser. No. 62/485,226, filed Apr. 13, 2017, and United Kingdom Patent Application Ser. No. 1706637.4, filed Apr. 26, 2017, each of which is incorporated by reference herein in its entirety.

TECHNICAL FIELD

Embodiments disclosed herein relate to MEMS devices, including devices that include MEMS transducers.

BACKGROUND INFORMATION

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry, for example, are driving the components to become smaller with higher functionality and reduced cost. It is therefore desirable to integrate functions of electronic circuits together and combine them with transducer devices such as microphones and speakers. Micro-electro-mechanical system (MEMS) transducers, such as MEMS microphones, are therefore finding application in many of these devices.

Microphone or pressure sensor devices formed using MEMS fabrication processes typically comprise one or more membranes with electrodes for read-out/drive that are deposited on or within the membranes and/or a substrate or back plate. In the case of MEMS pressure sensors and microphones, the electrical output signal read-out is usually accomplished by measuring a signal related to the capacitance between the electrodes.

To provide protection the MEMS transducer will be contained within a package. The package effectively encloses the MEMS transducer and can provide environmental protection and may also provide shielding for electromagnetic interference (EMI) or the like. The package also provides at least one external connection for outputting the electrical signal to downstream circuitry. For microphones, pressure sensors and the like the package will typically have a sound port to allow transmission of sound waves to/from the transducer within the package, and the transducer may be configured so that the flexible membrane is located between first and second volumes, i.e. spaces/cavities that may be filled with air, and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed. However, it will be appreciated by one skilled in the art that for MEMS microphones and the like the first and second volumes may be connected by one or more flow paths, such as small holes in the membrane, that are configured so as to present a relatively high acoustic impedance at the desired acoustic frequencies but which allow for low-frequency pressure equalisation between the two volumes to account for pressure differentials due to temperature changes or the like.

The package may contain circuitry on the same or a separate semiconductor die as the membrane. The function of the circuitry is to measure a transducer signal related to the capacitance between the electrodes, and the circuitry may also provide one or more audio processing functions such as filtering, equalisation and the like. The integrated circuit may also provide bias to the electrodes, analog to digital conversion, analog or digital signal conditioning, an analog or digital output interface, and/or other functions.

The electrical transducer signal from the electrodes at normal sound levels is small, typically only a few millivolts. However, the supply voltage may have noise or ripple superimposed on it. For various reasons, a microphone may often be mounted at positions on the host device some way away from where the power supply voltage is generated, for example on the end of a long flex circuit to a corner of a device, or may be mounted for example under the antenna of a mobile phone where the supply voltage may be modulated by pulses of RF energy in the transmitted signal. In mobile phones, to save energy, it is common for major current-consuming blocks to be duty-cycled in operation to reduce average power consumption, for example in GSM phones with a duty-cycled RF transmitter, giving rise to time-varying changes in supply or ground connections despite reasonable attempts to mitigate these issues.

It is thus desirable to improve power supply rejection (PSR) performance of MEMS microphones such that variations and noise in a power supply voltage have little effect on any output signal from the integrated circuitry. However, providing good power supply rejection has proven to be difficult to achieve in practice.

SUMMARY OF EMBODIMENTS

According to a first aspect, there is provided a micro-electro-mechanical system (MEMS) device comprising: a semiconductor die including integrated circuitry; a structure mounted on the semiconductor die and covering at least a portion of the circuitry, the structure defining a space between the structure and the at least a portion of the circuitry; and a transducer including a membrane, the transducer located outside of the space.

In some embodiments, the structure includes side walls mounted on the semiconductor die and a first layer, wherein side walls and the first layer define the space. The structure may include, in some examples, at least one additional layer formed on the first layer.

In some embodiments, the transducer includes a transducer backplate layer adjacent to and spaced apart from the membrane, the transducer backplate layer and the membrane forming a capacitive transducer. In some examples, the transducer backplate layer and at least part of the structure comprise the same material, comprise a continuous layer, and/or are formed in the same formation step. In some examples, the structure includes a back layer spaced apart from the at least a portion of the circuitry, and wherein the back layer is thicker than the transducer backplate layer.

In some embodiments, the transducer is integrated on the semiconductor die. The device may in some embodiments comprise a second membrane within the space. The membrane and the second membrane may in some examples comprise the same material, comprise a continuous layer, and/or be formed in the same formation step.

In some embodiments, the device further comprises a metal layer formed on the semiconductor die or on the structure, and at least one metal connector extending from the metal layer to a heat sink. The metal layer may in some examples be at least partially located within the space. In some cases, at least part of the metal layer is embedded within the structure. In some examples, the metal layer is formed on a face of the integrated circuitry or the structure, and wherein the metal layer covers at least 50% of the face.

In some embodiments, the device further comprises a package that defines a volume that contains the integrated circuitry, the structure and the transducer, the package including at least one port for allowing sound or pressure waves to interact with the membrane.

In some embodiments, the structure includes at least one hole. In some embodiments, the space contains air, a gas or a solid material.

In some embodiments, the space contains a vacuum.

In some embodiments, at least part of the structure is formed of silicon nitride.

According to a second aspect, there is provided a MEMS device comprising: a semiconductor die; a transducer including a membrane; a metal layer formed on a face of the semiconductor die, wherein the metal layer covers at least 50% of the face; and at least one metal connector extending from the metal layer to a heat sink.

In some embodiments, the metal layer covers a majority of the face of the semiconductor die, substantially all of the face, or all of the face.

In some embodiments, the transducer includes a transducer layer adjacent to and spaced apart from the membrane, the transducer layer and the membrane forming a capacitive transducer.

In some embodiments, the transducer is integrated with integrated circuitry on the same semiconductor die.

In some embodiments, the device further comprises a package that defines a volume that contains the semiconductor die and contains the membrane, the package including at least one port for allowing sound or pressure waves to interact with the membrane.

According to a third aspect, there is provided a method of forming a MEMS device, the method comprising: forming a semiconductor die including integrated circuitry; forming a structure mounted on the semiconductor die and covering at least a portion of the circuitry, the structure defining a space between the structure and the at least a portion of the circuitry; and forming a transducer including a membrane, the transducer located outside of the space.

In some embodiments, the method further comprises forming a second membrane within the space. In some embodiments, the membrane and the second membrane are formed in the same formation step.

In some embodiments, forming the transducer further comprising forming a transducer layer adjacent to and spaced apart from the membrane, the transducer layer and the membrane forming a capacitive transducer. The transducer layer is in some examples formed in the same formation step as at least part of the structure.

In some embodiments, forming the structure comprises forming side walls on the semiconductor die and a first layer on the side walls such that the side walls and the first layer define the space.

In some embodiments, the method further comprises forming a vacuum within the space.

In some embodiments, the method further comprises mounting the semiconductor die within a package that defines a volume that contains the semiconductor die, the structure and the membrane, the package including at least one port for allowing sound or pressure waves to interact with the membrane.

In some embodiments, the method further comprises forming a metal layer on the semiconductor die or on the structure, and providing at least one metal connector extending from the metal layer to a heat sink. The metal layer is in some examples at least partially located within the space. In some examples, at least part of the metal layer is embedded within the structure. In some examples, forming the metal layer comprises forming the metal layer on a face of the semiconductor die circuit or the structure, such that the metal layer covers at least 50% of the face.

According to a fourth aspect, there is provided a method of forming a MEMS device, the method comprising: forming a semiconductor die; forming a transducer membrane; forming a metal layer on a face of the semiconductor die or a face of integrated circuitry integrated within the semiconductor die, wherein the metal layer covers at least 50% of the face; and providing at least one metal connector extending from the metal layer to a heat sink.

In some embodiments, the method further comprises forming a transducer layer adjacent to and spaced apart from the transducer membrane, the transducer layer and the membrane forming a capacitive transducer.

In some embodiments, the method further comprises mounting the semiconductor die within a package that defines a volume that contains the semiconductor die and the membrane, the package including at least one port for allowing sound or pressure waves to interact with the membrane.

According to a fifth aspect, there is provided a device including the MEMS device of the first aspect. In some embodiments, the device is one of a mobile telephone, tablet computer, laptop computer, microphone, desktop computer and data processing device.

According to a sixth aspect, there is provided a MEMS device comprising a semiconductor die and a membrane, the MEMS device further comprising structural elements that define a space, wherein in use heat generated by the semiconductor die is substantially contained within the space and/or within the structural elements so as to reduce thermoacoustic coupling between the semiconductor die and the membrane.

According to a seventh aspect, there is provided a micro-electro-mechanical system (MEMS) device comprising: a capacitive transducer including a membrane; integrated circuitry; a structure arranged to reduce the effect of change in temperature of the integrated circuitry, due to changes in a supply voltage provided to the integrated circuit, on the membrane.

According to an eighth aspect, there is provided a micro-electro-mechanical system (MEMS) device comprising: a semiconductor die including circuitry; a structure surrounding the circuitry and defining a space between the structure and the circuitry; and a transducer including a membrane, the transducer located outside of the space and not contacting the space.

According to a ninth aspect, there is provided micro-electro-mechanical system (MEMS) device comprising: a capacitive transducer including a membrane; an air volume in acoustic communication with the membrane; a semiconductor die comprising circuitry integrated in one surface of the die; and a structure located between said surface and said air volume, said structure comprising a backplate located overlying and spaced apart from at least part of said integrated circuitry to define a space between the backplate and the circuitry.

In some embodiments, said space is bounded by said structure so as to be substantially not in acoustic communication with said membrane.

According to a tenth aspect, there is provided a semiconductor MEMS die comprising: a capacitive transducer including a membrane; circuitry integrated in one surface of the die; and a structure comprising sidewalls located on said surface supporting a backplate overlying and spaced apart from at least part of said integrated circuitry to define a space between the backplate and the circuitry; said space being substantially bounded by said sidewalls and said backplate so as to be not in acoustic communication with air outside said structure.

According to an eleventh aspect, there is provided a semiconductor MEMS die comprising: a capacitive transducer including a membrane; circuitry integrated in one surface of the die, said circuitry comprising a voltage regulator circuit; and a metal bond pad overlying at least part of said regulator.

According to a twelfth aspect, there is provided a MEMS microphone packaged device comprising: an integrated MEMS microphone comprising a MEMS transducer and circuitry, said MEMS transducer comprising a membrane, wherein the integrated MEMS microphone also comprises a thermal impedance structure mounted above at least part of the circuitry for reducing the effect of change in temperature of the circuitry on the membrane.

According to a thirteenth aspect, there is provided a MEMS microphone packaged device comprising: a MEMS transducer die comprising a membrane; and a second die comprising integrated circuitry operatively coupled to the MEMS transducer, wherein the second die comprises a thermal impedance structure mounted above at least part of the integrated circuitry for reducing the effect of change in temperature of the integrated circuitry on the membrane.

According to a fourteenth aspect, there is provided a micro-electro-mechanical system (MEMS) device comprising: a semiconductor die comprising a MEMS transducer and integrated circuitry; and a structure mounted on the semiconductor die that at least covers at least a portion of the integrated circuitry, the structure defining a cavity between the structure and the semiconductor die.

According to a fifteenth aspect, there is provided a monolithic semiconductor die comprising: circuitry provided in a first circuitry region of the die;

a MEMS transducer provided in a second transducer region of the die; and an enclosure provided on a thermal flow path between the first circuitry region and the second transducer region.

The enclosure defines a substantially enclosed volume and may be provided so as to at least partially overlie the circuitry. The circuitry region or at least a part of the circuitry may be provided in a plane below the transducer region. The enclosure may be at least partly defined by a structure which is provided above an upper surface of the die, or above the uppermost layer of circuitry. The enclosure may be at least partly defined by a cavity formed within the die. The enclosure may comprise a thermal low pass filter. The volume within the enclosure may comprise air, a gas or a vacuum. The volume may comprise solid material having a low thermal conductivity.

According to a sixteenth aspect, there is provided a monolithic semiconductor die comprising: circuitry provided in a first region of the die;

a MEMS transducer provided in a second region of the die;

a thermal low pass filter provided in a third region of the die that overlies at least a part of the first region.

The thermal low pass filter may be provided on a thermal flow path between the circuitry region and the transducer region.

According to one arrangement the MEMS transducer is in acoustic communication with a back volume, the circuitry is in thermal communication with the low pass filter and the low pass filter is in thermal communication with the back volume.

According to a seventeenth aspect, there is provided an electronic apparatus comprising a device according to at least one of the aspects disclosed herein, wherein said apparatus is at least one of: a portable device; a battery power device; a computing device; a communications device; a gaming device; a mobile telephone; a personal media player; a laptop, tablet or notebook computing device.

BRIEF DESCRIPTION OF THE FIGURES

Embodiments will now be described by way of non-limiting example only with reference to the accompanying Figures, in which.

DETAILED DESCRIPTION OF EMBODIMENTS

Figure 1:
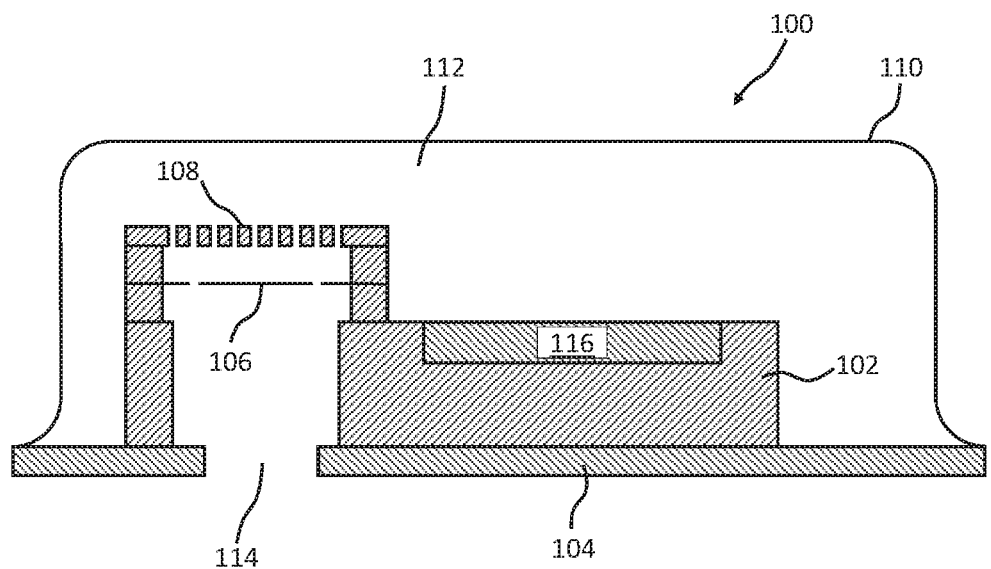
FIG. 1 illustrates a cross section of an example of a MEMS device.

FIG. 1 illustrates a cross-section of an example of a packaged MEMS microphone device 100. The device 100 includes a semiconductor die 102 mounted on a package substrate 104. The semiconductor die 102 includes both circuitry 116 and a co-integrated MEMS transducer including a membrane 106 and back plate 108. The membrane 106 and back plate 108 are positioned adjacent to and spaced apart from each other, and each includes an electrode (not shown), or is conductive and thus forms an electrode, such that they form the plates of a capacitor. Therefore, in this example, the semiconductor die 102 contains integrated circuitry 116 and a MEMS transducer structure. In other examples the MEMS transducer elements may be implemented on a separate semiconductor die.

The integrated circuitry 116 and MEMS transducer may be packaged in a number of ways. For example, as shown in FIG. 1, the semiconductor die 102 comprising the MEMS transducer is mounted on the package substrate 104 and covered by a lid 110 to define a volume 112 which may serve as for example the back volume of a MEMS microphone. In examples where the MEMS transducer is implemented as a separate semiconductor die the semiconductor die 102 and the MEMS transducer semiconductor die may be attached separately to a common package substrate and covered by a common lid to define a common volume. However, other packaging types may instead be used. For instance, in wafer-level chip-scale packaging (WLCSP) examples the package substrate 104 may be absent, and external connections may be made directly from the lower surface of a single semiconductor die incorporating the transducer and circuitry, with a lid structure mounted directly onto the die to provide a back volume.

In general for space reasons and structural simplicity there will be a common volume communicating with both the MEMS transducer and associated integrated circuitry whether or not these are integrated on a single die or a plurality of die, and whether or not the device comprises a separate package substrate.

The package substrate 104 includes an acoustic port 114 that may comprise a sound port of a MEMS microphone. The back plate 108 includes a plurality of holes that provide channels from the volume between the membrane 106 and the back plate 108 to the volume 112. The membrane 106 includes one or more holes to allow low frequency pressure equalisation between the volume 112 and the air surrounding the device 100.

In use, sound or pressure waves may enter the acoustic port 114 of the MEMS microphone device 100 and interact with the membrane 106, causing the membrane to move in a vertical direction as shown in FIG. 1, or to tend to move in this direction. In other words, the membrane may experience a force in a direction towards or away from the back plate 108, due to a sound or pressure wave. An incident sound pressure wave, for example, may thus cause the distance between the membrane 106 and back plate 108, and their associated electrodes, to change, and therefore the capacitance between the electrodes changes. This change in capacitance can be detected by the integrated circuitry 116, which may output an electrical output signal representing the sound or pressure waves that caused the movement of the membrane 106. Accordingly, the device 100 may include connections (not shown), such as metal interconnects, between the electrodes and the integrated circuitry 116.

Figure 2:
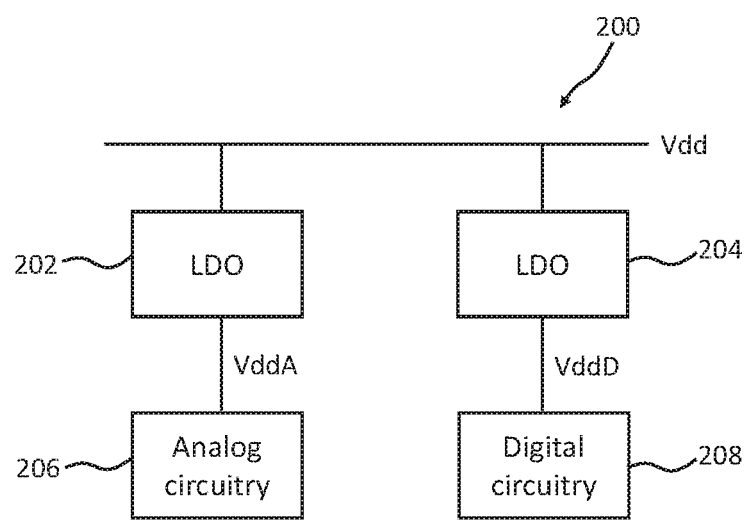
FIG. 2 illustrates an example of at least a portion of an integrated circuit.

FIG. 2 illustrates an example of at least some of the circuitry 200 that may be included in the semiconductor die 102. The circuitry 200 may include one or more voltage regulators such as low-dropout (LDO) regulators. Two LDO regulators 202 and 204 are shown in FIG. 2. Each LDO regulator receives a voltage, such as a power supply voltage Vdd, and outputs a substantially constant voltage to other parts of the circuitry. For example, the LDO regulator 202 receives voltage Vdd and provides a first regulated voltage (VddA) to analog circuitry 206. Similarly, the LDO regulator 204 receives the voltage Vdd and provides a second regulated voltage (VddD) to digital circuitry 208. In one example implementation, the voltage Vdd is 1.8V, the first regulated voltage is 1.6V, and the second regulated voltage is 1.0V, though other voltages may be used in other implementations.

The LDO regulators 202 and 204 provide respective substantially constant voltages, i.e. substantially constant supply voltages, to the associated analog and digital circuitry 206 or 208 even in the presence of power supply fluctuations and noise. Therefore, in some implementations, the current consumption of the integrated circuitry is substantially constant even with changes ΔVdd in power supply voltage Vdd. As a result, the power consumption of the integrated circuit circuitry, being the product of the supply voltage Vdd and the current flowing from the supply terminal to ground, is proportional to the supply voltage level Vdd and thus changes linearly with ΔVdd.

In other examples the supply voltage for at least some of the analog or digital circuitry may be derived without using LDOs but bias voltages for components in the circuitry may be generated so as to still result in substantially constant current draw by the circuitry 200. For example, a bias current may be generated using a substantially supply independent reference voltage such as a bandgap voltage. In still other examples, the current drawn by the circuitry may vary due to variations and noise in the supply voltage Vdd, and hence the power consumption of the circuitry 200 may vary non-proportionally to the supply voltage.

The circuitry 200 shown in FIG. 2 is merely an example and other implementations of the integrated circuitry may include more or fewer components, or different components, to those shown in FIG. 2. For example, the integrated circuitry may have more or fewer LDO regulators, or may have no LDO regulators, and may include analog circuitry and/or digital circuitry as appropriate. In at least some implementations, however, the power consumption depends on the supply voltage level, and may thus fluctuate with fluctuations and noise in the supply voltage level.

Figure 9:
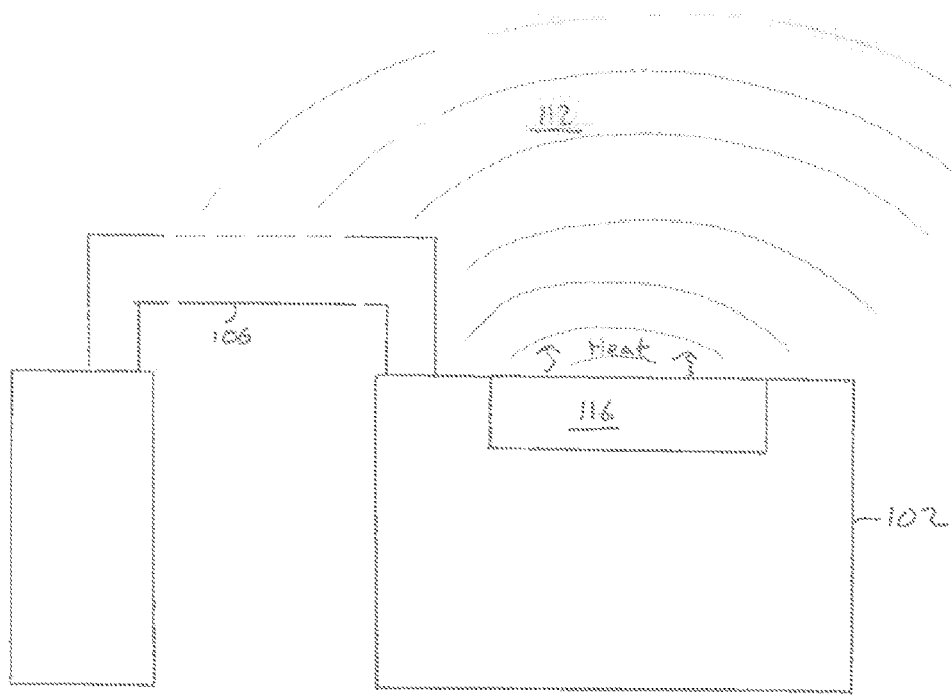
FIG. 9 illustrates the dissipation of heat from the integrated circuitry.

A problem with the device 100 of FIG. 1 is that in use, the integrated circuitry 116 consumes power and generates heat, at least some of which dissipates into the air in the back volume 112. This is illustrated simplistically in FIG. 9 wherein heat is dissipated vertically and horizontally or in other words upwards and outwards. As the power consumption changes due to fluctuations and noise in the power supply voltage level, the temperature of the air in the back volume 112 may thus increase and decrease. As a result, thermal expansion of the air in the back volume 112 may cause variation of the pressure in the back volume. Since the back volume is in acoustic communication with the membrane 106, this pressure is exerted on the membrane 106, resulting in movement of the membrane 106. This may be detected by the integrated circuitry 116 as a signal which may be indistinguishable from signals due to sound or pressure waves incident on the membrane via the acoustic port 114, particularly if the supply voltage modulation contains audio frequency components.

It will be appreciated that in arrangements where the volume "behind" the membrane—i.e. on the other side of the membrane to the die cavity—is not sealed within a package, the effects of heat dissipation on the membrane may still give rise to thermal effects on the membrane due to the horizontal or outwards heat dissipation.

Figure 3:
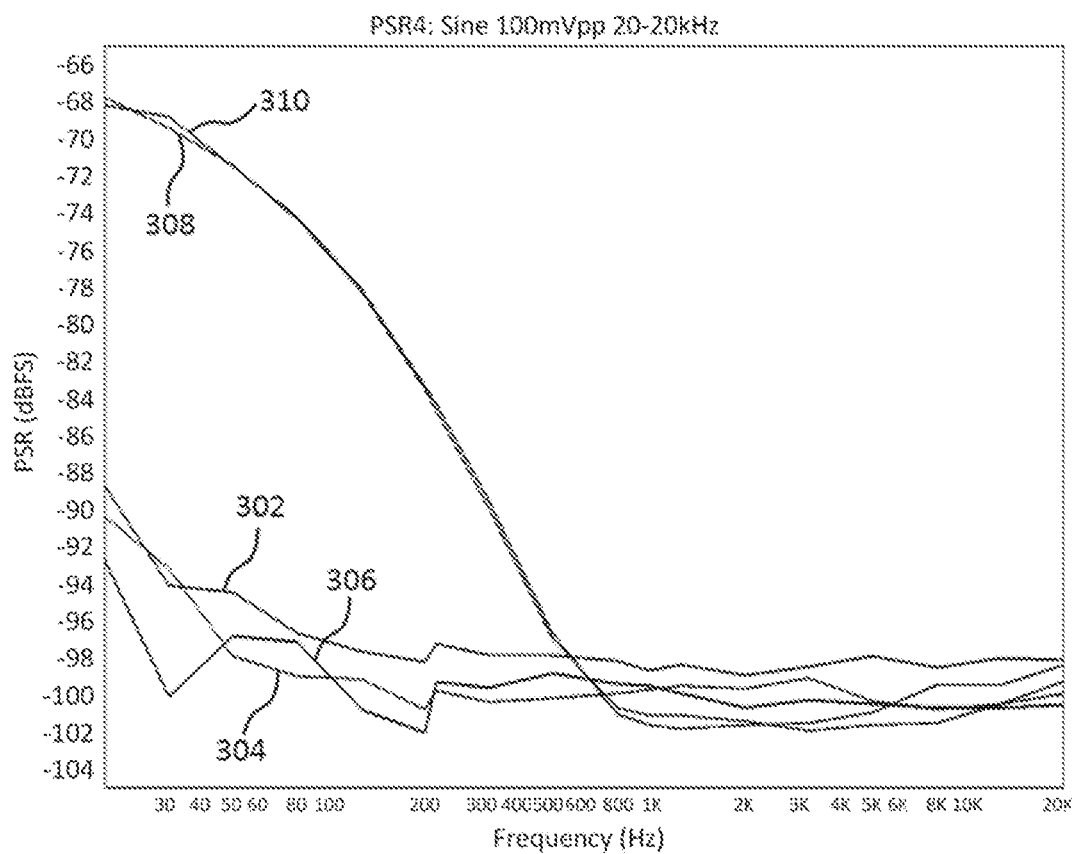
FIG. 3 illustrates an example of a chart illustrating performance of the device of FIG. 1 during testing.

FIG. 3 illustrates the power supply rejection (PSR) performance of an example MEMS microphone device similar to the device 100 of FIG. 1 during testing with no acoustic stimulus present but with a sine wave of variable frequency superimposed on the supply voltage. FIG. 3 shows the amplitude of the resultant signal coupled onto the electrical output against frequency of the superimposed sine wave. The lower three curves 302, 304 and 306 represent the device in a vacuum, whereas the upper two curves 308 and 310 represent the device in air. It can be seen that the coupled output signal amplitude is relatively low and substantially independent of frequency in a vacuum, whereas in air the coupled output signal amplitude begins to rise below around 1 kHz and rises considerably as the frequency is lowered, reaching around −68 dBFS at 20 Hz, compared to the residual level of less than −90 dBFS coupled in a vacuum.

The cause for this is the repeated heating and cooling of the air in the back volume 112 (in particular the air closest to the surface of circuitry 116) due to the increase and decrease in the power consumption of the integrated circuitry 116, resulting in thermal modulation of the air pressure in the whole back volume and thus movement of the membrane 106 at the associated frequency. In other words, there is thermoacoustic coupling between the integrated circuitry 116 and the membrane 106, as the movement of the membrane may be detected by the integrated circuitry 116 indistinguishably from any movement of the membrane due to similar acoustic or sound pressure waves received via the acoustic port 114.

Embodiments as disclosed herein may at least partially prevent heat dissipation from integrated circuitry in a MEMS device from heating air in the back volume, which may improve the PSR performance, particularly at frequencies lower than around 1 kHz. For example, a MEMS transducer in some embodiments may comprise a semiconductor die with circuitry integrated therein, a structure mounted on the semiconductor die and covering at least a portion of the circuitry, the structure defining a space adjacent to at least part of the circuitry (or overlying at least part of the circuitry), and a transducer membrane located outside of the space. At least some of the heat from the semiconductor die may therefore be contained within the space, which may reduce the thermoacoustic coupling between the integrated circuitry and the membrane of the transducer. Additionally or alternatively, at least some of the heat may be contained within a part of the structure, which in some examples may include a backplate spaced apart from the circuitry.

Figure 4A:
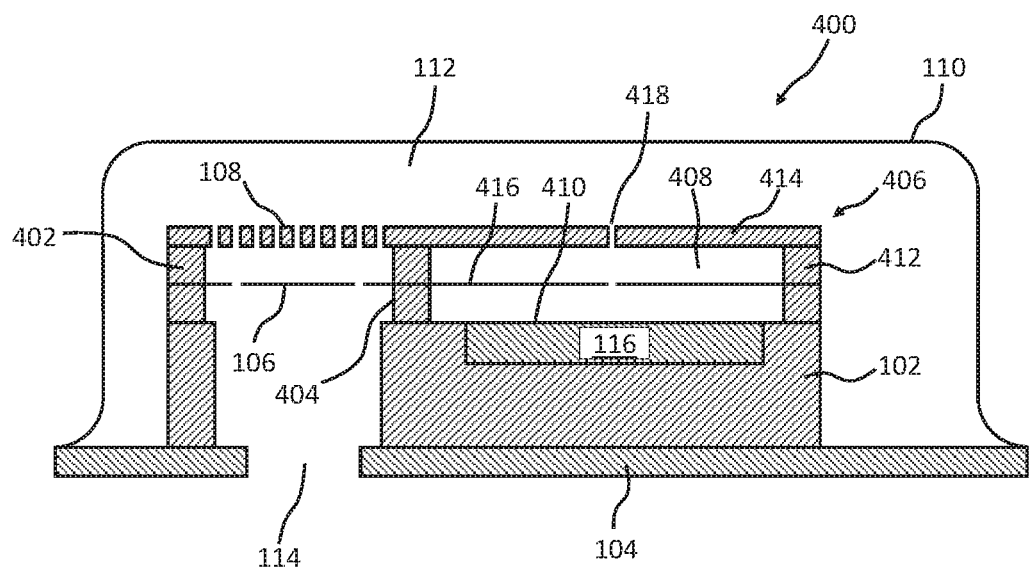
FIGS. 4A-C illustrate cross sections of embodiments of a MEMS device.
Figure 4B:
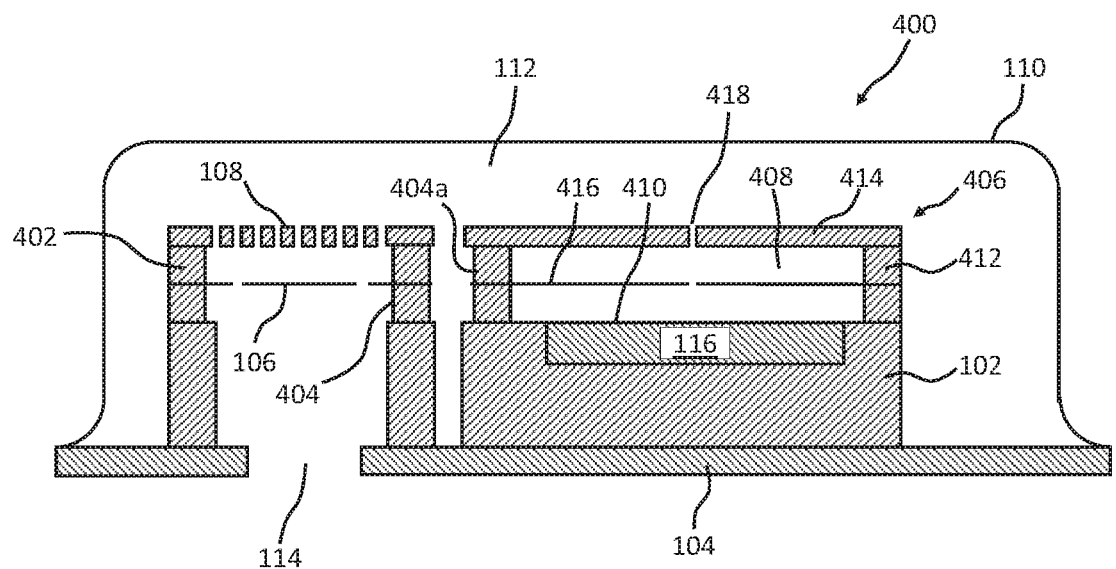

FIG. 4A shows a cross-section an example of an embodiment of a packaged MEMS device 400, which is for example a MEMS microphone. Features similar to those shown in FIG. 1 are given the same reference numerals. The device 400 includes a semiconductor die 102 with circuitry 116 integrated therein, and a MEMS transducer comprising membrane 106 and back plate 108 also integrated therein. The integrated circuitry 116 and transducer are integrated in that, for example, they are formed on the same silicon wafer and are formed simultaneously during the same processing steps, and form a single monolithic die 102 when the wafer is singulated (i.e. separated into separate die). The integrated circuitry 116 and transducer may in some cases therefore be adjacent to each other and may be joined together. However, it is noted that the integrated circuitry 116 and transducer being integrated is not a requirement and in other embodiments the integrated circuitry 116 and transducer may not be co-integrated, for example as illustrated in FIG. 4B they may be formed on separate silicon die 102, 102a and packaged together as a single MEMS device.

In either case, the integrated circuitry 116 and transducer may be mounted on a package substrate 104 that includes a port 114 such as an opening or aperture for example that allows sound or pressure waves to interact with the membrane 106. Side walls 402 and 404 rest on the semiconductor die 102 to support the membrane 106 and back plate 108. The membrane 106 and back plate 108 each include or form an associated electrode (not shown) that form electrodes of a capacitive transducer.

A lid 110 is also mounted on the package substrate 104 and defines a volume 112 that contains the one semiconductor die 102 (or plurality of die when not co-integrated) comprising integrated circuitry 116 and the transducer. However, in other embodiments, different packaging types may be used.

The device 400 further includes a structure 406. The structure defines a space 408 that thermally insulates the membrane from the integrated circuit, the structure or space being adjacent to the semiconductor die 102, in particular adjacent to the circuitry 116. In the example device 400 shown, the structure 406 is mounted on the semiconductor die 102 and covers the circuitry 116. In this example, the space 408 is a cavity that is between the structure 406 and an upper surface 410 of the semiconductor die 102, the upper surface 410 being the surface that faces towards a substantial part of the volume 112. In the example shown in FIG. 4A, the structure 406 comprises side walls 404 and 412 and an upper layer 414. In this example, the sidewall 404 is shared with the transducer, though in other embodiments this sidewall may be distinct from the sidewall supporting the membrane and backplate of the transducer, i.e. there may be a lateral gap between structure 406 and the transducer, whether the transducer is co-integrated, or whether the transducer is on a separate die with separate portions of sidewall 404 and 404a as illustrated in FIG. 4B.

The upper layer 414 is therefore spaced apart from the upper surface 410 of the semiconductor die 102. The upper layer 414 may be formed in the same layer as the back plate 108. For example, in some embodiments, the back plate 108 and upper layer 414 may be formed in the same processing step or steps, and as such the formation of the structure adds little or no processing cost and/or few or no additional processing steps when compared to production of, for example, the device of FIG. 1. The side walls 404 and 412 may include other walls not shown in FIG. 3 to define the space 408. For example, front and back walls (not shown) may also be present to define the space 408.

In use, the integrated circuitry 116 of the device 400 may generate heat. This heat may radiate or conduct into the space 408, and thermally cause an increase in pressure of any air in space 408. However, the structural elements of structure 406 enclosing this space prevent any acoustic communication from the air in the space to the volume 112 or membrane 106. It is only the heat which is transferred into the air in volume 112 which will impose acoustic waves on the membrane 106.

Moreover, the structural elements of structure 406 may have significant thermal mass and thus may reduce the rate at which this heat propagates to the volume 112. As a result, the rate of thermal expansion of the air in the back volume 112 is reduced, thus reducing the thermoacoustic coupling between the integrated circuitry 116 and the membrane 106 because the membrane 106 is located outside of the space 408. Therefore, the device 400 may have an improved power supply rejection (PSR) performance, particularly with fluctuations and noise in the power supply voltage level at frequencies below around 1 kHz for example.

The structure 406 may be formed using layers of material deposited on lower layers or on sacrificial layers where appropriate. For example, in some embodiments, the side walls 404 and 412 and upper layer 414 (which may in some examples be referred to as a backplate) of the structure 406 are formed of silicon nitride, although any suitable materials may be used to form any part of the device. The upper layer 414 may be deposited onto a sacrificial layer or layers of any appropriate type, such as polyimide, within the space 408. The sacrificial layer or layers may subsequently be removed using any appropriate process, for example using oxygen plasma to remove polyimide. In some embodiments, the upper layer 414 includes one or more holes 418 for facilitating removal of the sacrificial layer or layers. The one or more holes 418 may be configured so as to present a relatively high acoustic impedance at the desired acoustic frequencies but which allow for the sacrificial layer or layers to be removed.

In some embodiments, the thermal time constant of the thermal resistance of the space 408 and the thermal capacitance of the upper layer (e.g. backplate) is arranged to effectively give a low pass cut-off frequency for propagation of heat fluctuations from the circuitry 116 to the volume 112 of below 1 kHz for example, and in some cases 100 Hz or lower. Thus the flow into the volume 112 of any heat fluctuations of a frequency above this cut off frequency will be attenuated, as desired. In this sense, the structure and associated space defined by the structure can be considered to be a thermal low pass filter. The thermal low pass filter is provided above a plane which overlies at least a part of the circuitry region of the die.

To increase the thermal time constant, and thus improve the attenuation, the backplate element of structure 406 should be relatively massy, and thus as thick as possible. However, the backplate covering the transducer membrane requires holes 418 to acoustically couple the space immediately above the membrane to the volume 112. These should preferably present a low acoustic impedance to avoid attenuating the response of the membrane. Thus the back plate portion covering the membrane should preferably be as thin as possible, subject to other constraints such as mechanical rigidity.

Figure 4C:
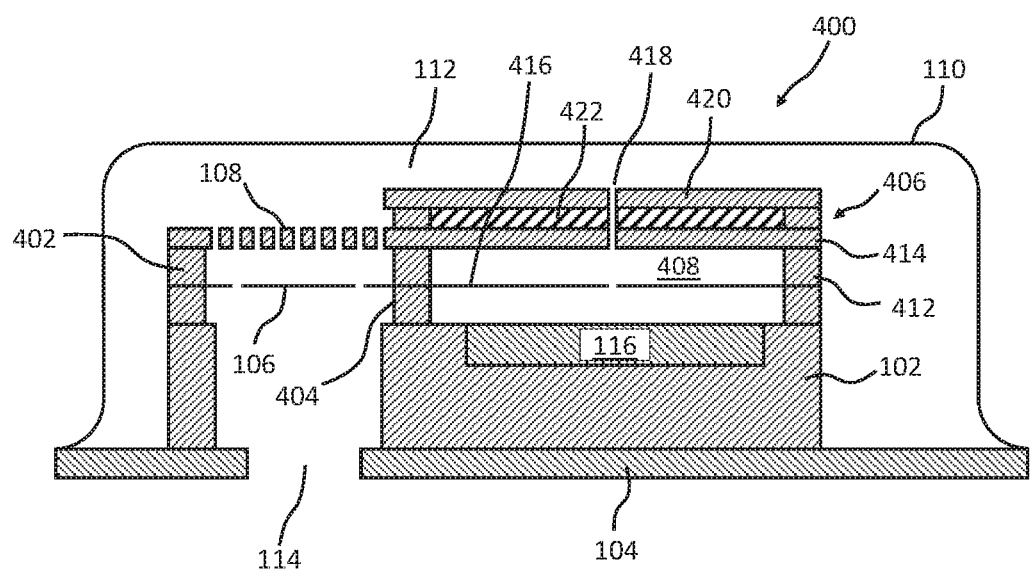

Thus, as illustrated in the embodiment of FIG. 4C, the thickness of the region of backplate structure covering the circuitry 116 (or at least a majority of this region) is in this example thicker than the region of backplate covering the membrane (or at least a majority of this region).

The thicker structural backplate over the circuitry 116 may be provided by adding one or more additional layers of material to this region of backplate. For example, the additional thickness may be provided by an additional layer of dielectric 420, for example silicon nitride. In some embodiments a layer of metal 422 may be provided. These layers may have higher thermal conductivity than the air they displace, but these layers are relatively thin, so their benefit of orders of magnitude more thermal mass is more significant in increasing the thermal time constant of the structure 406. In further embodiments there may be further additional layers of metal and/or dielectric.

The space 408 may in some embodiments, as illustrated in FIGS. 4A, 4B and 4C, include a second membrane 416 that in some embodiments is formed in the same layer as the membrane 106, and may be formed in the same processing step or steps. The second membrane 416 may include one or more holes for facilitating removal of any underlying sacrificial layers. The second membrane 416 may provide further thermoacoustic impedance at the desired acoustic frequencies between the integrated circuitry 116 and the volume 112, and may therefore further reduce thermoacoustic coupling between the integrated circuitry 116 and the membrane 106.

In the example shown, the one or more holes 418 are open and thus the space 408 is filled with air. However, in other embodiments, the holes 418 may be sealed after the structure 406 is formed. In such embodiments, the space 408 may be filled with air or some other gas or substance, such as a gas with low thermal conductivity for example xenon or argon. In some embodiments, some or all of the space may be filled with a solid substance, such as one with low thermal conductivity, for example a low thermal conductivity aerogel such as a silica aerogel. This may advantageously provide extra structural rigidity to the thermal structure 406. In some embodiments some or all of the space 408 may be evacuated to form a vacuum within the space 408. Such embodiments may even further reduce the effect of power supply fluctuations and noise on the membrane 106. In other embodiments, the upper layer 414 may be formed without holes. In such cases, the underlying sacrificial layers may be removed in another manner, or may be left present, or the layer 414 may be provided without using sacrificial layers.

Other embodiments provide devices in which the occurrence or magnitude of movement of the membrane due to changes in power consumption of the integrated circuitry is reduced. For example, a MEMS transducer may include a semiconductor die comprising integrated circuitry, a membrane, a metal layer formed on a face of a region of the semiconductor die comprising integrated circuitry, wherein the metal layer covers at least 50% or at least 90% of the surface, and at least one bond wire extending from the semiconductor die to a sink of heat, receiver of heat, thermal reservoir or thermal mass, referred to collectively herein as a heat sink. The metal layer thus captures heat generated, and at least some of the heat is conducted away from the metal layer by the bond wire or wires and to the heat sink.

The heat sink may be, for example, a package substrate of the device, in some cases coupled to an external circuit board or a body of an apparatus such as a host device to provide a more significant thermal reservoir. The heat may then be conducted away to the ambient environment, possibly via other structures or heat sinks of the apparatus.

Figure 5:
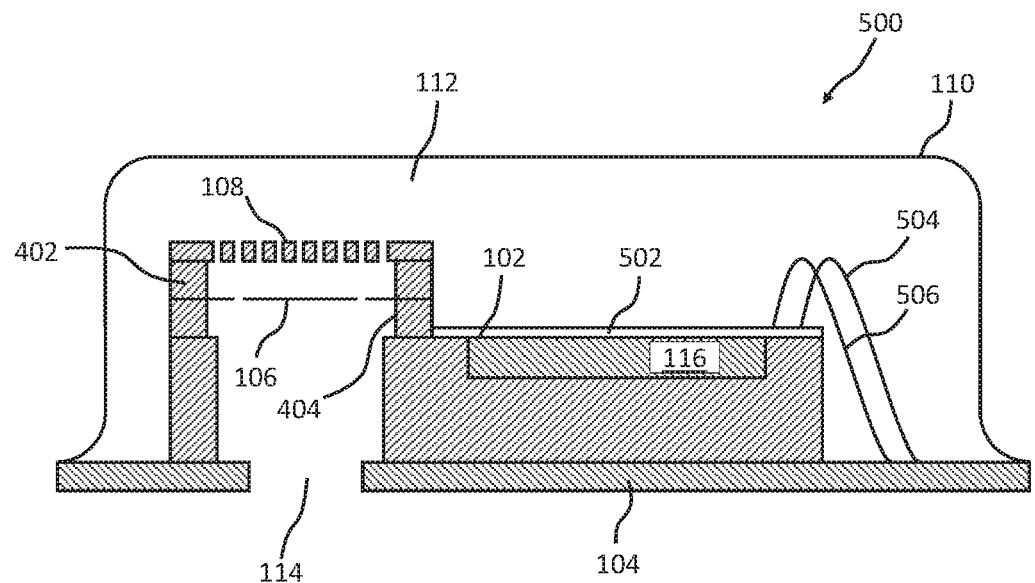
FIG. 5 illustrates a cross section of another embodiment of a MEMS device.

FIG. 5 thus shows a cross section of another example of a device 500 such as a MEMS microphone for example. Features similar to those in FIGS. 1 and/or 4 are given the same reference numerals. The device 500 includes integrated circuitry 116, a MEMS transducer including membrane 106 and backplate 108 and associated electrodes (not shown), package substrate 104 with sound port 114 and lid 110.

The device 500 includes a metal layer 502 formed on a surface of the semiconductor die 102. For example, the metal layer is formed on an upper surface of the semiconductor die 102 as shown in FIG. 5. In some embodiments, the metal layer covers at least 50% of the surface. In FIG. 5, for example, the metal layer covers a substantial portion of the surface. The metal layer may be provided in addition to any other metal layers or patterns required to provide adequate electrical connectivity to components of the electronic circuitry. The metal layer may be contiguous over at least 75% of the surface area of the circuitry, or may be split into separate parts.

In some embodiments there may be further layers (not illustrated) covering the metal layer 502, for instance a layer of dielectric such as silicon nitride to passivate or protect the metal surface.

The device 500 also includes bond wires 504 and 506. The bond wires 504 and 506 are connected between the metal layer 502 and a heat sink. In the example shown, the substrate 104 serves as a heat sink, and therefore the bond wires are connected between the metal layer 502 and the substrate 104. In other embodiments, more or fewer bond wires may be used. Where two or more bond wires are used, each bond wire may be connected to the same heat sink or different heat sinks and to a common contiguous metal pattern or to separate regions of the metal layer or metal patterns.

In some embodiments, a heat sink may comprise the substrate 104 or another part of the device 500, such as a bond or solder pad, metallic structure, or any other suitable heat sink. The heat sink may be mounted on the outside of the substrate 104 or lid 110, external to the device 500 or in any suitable position. Heat received by the heat sink may then dissipate to the ambient environment, possibly via one or more other structures, typically an external circuit board external to the transducer device to which the package substrate is soldered or otherwise mechanically attached.

In use, some of the heat generated by the semiconductor die 102 is absorbed by the metal layer 502. Due to the relatively high thermal conductivity of the metal layer 502 and bond wires 504 and 506, at least some of the heat absorbed by the metal layer 502 will be conducted laterally by the metal layer 502 and the bond wires 504 and 506 via the substrate 104 to some external thermal reservoir or heat sink in this example. As a result, less heat is transferred to the back volume 112 compared to for example the device 100 of FIG. 1, and hence the effect of changes in temperature of the semiconductor die 102 (or of integrated circuitry 116) on the membrane 106 due to power supply fluctuations and noise is reduced.

Figure 6:
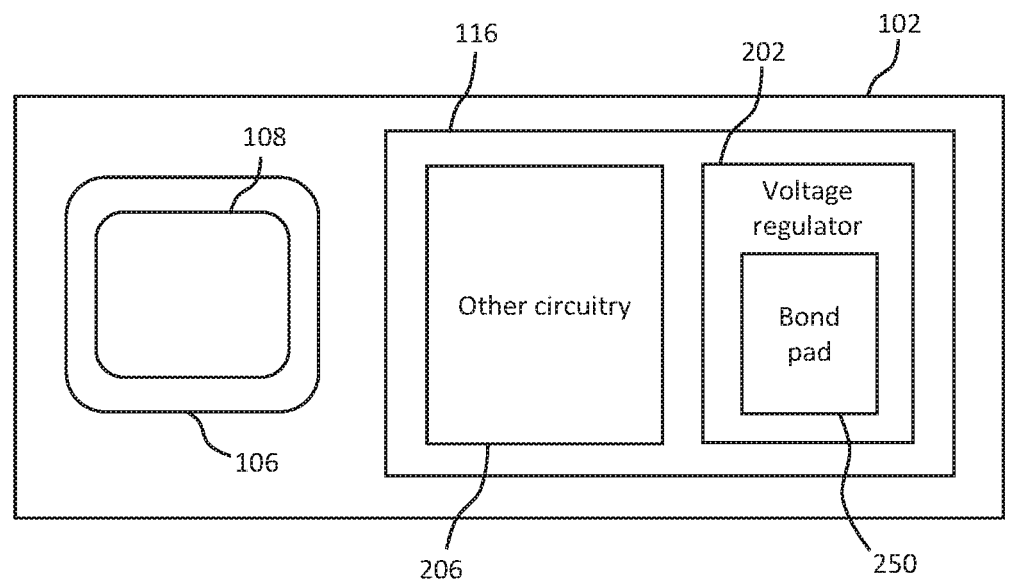
FIG. 6 illustrates a plan view of an embodiment of a MEMS device.

In embodiments where the circuitry is supplied by voltage regulators such as LDOs and thus runs at relatively constant current and voltage, substantially independent of the input voltage to the regulators, most of the supply-dependent components of power dissipation will occur in the regulators, particularly in the pass devices in the regulator. It may thus be advantageous to ensure that the regulators in the integrated circuitry 116 are located close to the locations of the bond pads for the bond wires 504, 506, in some cases at least partially lying under these bond pads, so as to reduce any lateral thermal resistance. In other words, in some cases there may be at least one bond pad overlying at least part of at least one regulator, to provide a low thermal resistance path to a sink of heat to shunt heat flow away from the volume 112. FIG. 6 illustrates a plan view of such an embodiment, where a semiconductor die 102 comprises a MEMS transducer including a membrane 106 and a transducer backplate 108, and also contains integrated circuitry 116 comprising a voltage regulator (such as an LDO) 202 and other circuitry 206. A bond pad 250 is positioned overlying part of the regulator area of the circuitry to efficiently transmit heat to any bond wire attached thereto.

Figure 7:
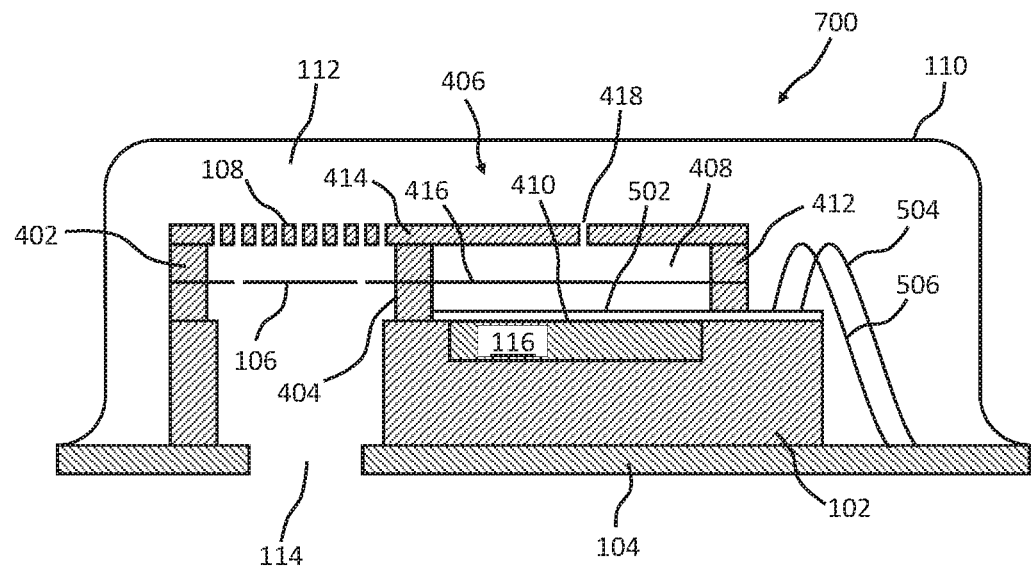
FIG. 7 illustrates a cross section of a further embodiment of a MEMS device.

FIG. 7 shows a cross section of a further embodiment of a device 700 that may be a MEMS microphone for example. Features similar to those in FIGS. 1, 4 and/or 5 are given the same reference numerals. The device 700 may be considered to be a combination of the devices 300 and 500. That is, the device 700 includes a metal layer 502 on a surface of the region of a semiconductor die comprising integrated circuitry, and a structure 406 that defines a space adjacent to a portion of the metal layer 502. Part of the metal layer 502 is exposed (i.e. not covered by the structure 406) in this example to allow for connection of one or more bond wires, although in other embodiments the structure covers substantially all of the metal layer 502, and heat may be transferred from the metal layer 502 to one or more heat sinks in other ways. For example, one or more metal interconnects such as metal vias through dielectric layers or through-silicon vias (TSVs) may pass through portions of the structure 406 and/or the semiconductor die 102.

In embodiments similar to that illustrated in FIG. 4C, with additional metal layer 422, bond wires may be attached to regions of this metal layer, or multiple metal vias (not illustrated) may connect layer 422 to lower layers connected to bond wires or other thermally conductive paths such as through-silicon vias. Metal layer 422 may be able to be manufactured in a thicker layer than other metal layers which may have to support patterning with small minimum dimensions to connect with physically small circuit elements. This thicker layer will have lower thermal resistance, so a lower shunt thermal impedance may be available by connection to this layer rather than the thinner lower layers.

In use, the integrated circuitry 116 of the device 700 of FIG. 7 generates heat, and the amount of heat generated may change due to fluctuations or noise on the power supply voltage level. The metal layer 502 and bond wires 504 and 506 may conduct at least some of this heat to a heat sink such as the package substrate 104 or via the package substrate 104. Some of the heat absorbed by the metal layer 502 could heat any adjacent air. Therefore, the structure 406 reduces the effect of this on the membrane 106 in a manner similar to that described above with reference to FIG. 3 and the device 300.

In the example shown, the one or more holes 418 are open and thus the space 408 is filled with air. However, in other embodiments, the holes 418 may be sealed after the structure 406 is formed. In such embodiments, the space 408 may be filled with air or some other gas or substance, preferably with a gas with low thermal conductivity for example xenon or argon or an aerogel of low thermal conductivity such as a silica aerogel, or may be evacuated to form a vacuum within the space 408.

Figure 8:
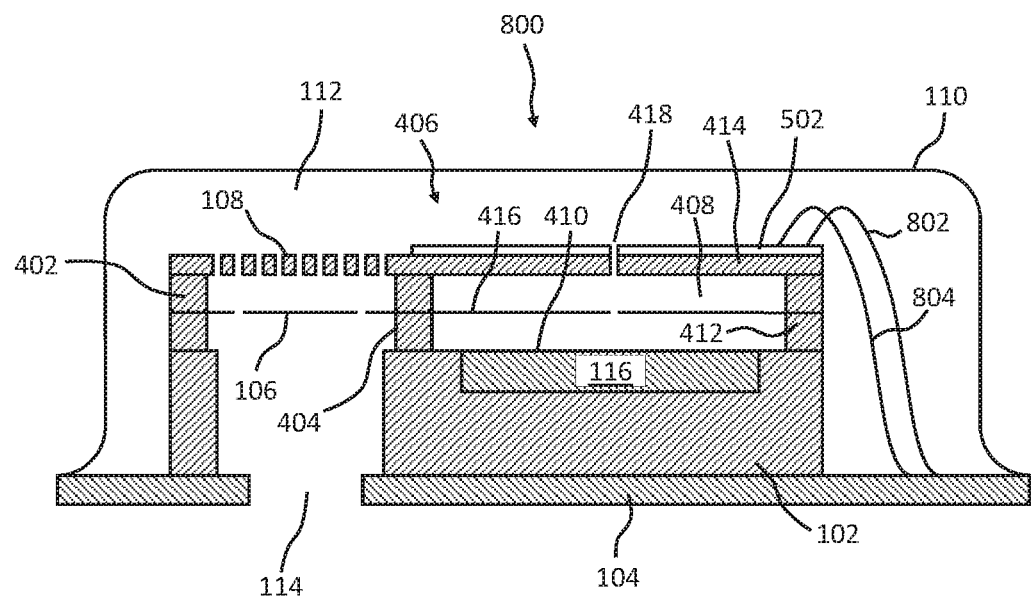
FIG. 8 illustrates a cross section of a further embodiment of a MEMS device.

FIG. 8 shows a cross section of a further embodiment of a device 800 that may be a MEMS microphone for example. Features similar to those in FIGS. 1, 4 and/or 5 are given the same reference numerals. The device 800 may be considered to be an alternative combination of the devices 300 and 500. That is, the device 800 includes a structure 406 that defines a space 408 adjacent to a part of the integrated circuitry 116, and a metal layer 502 on a surface of the structure 406. In some embodiments there may be further layers (not illustrated) covering the metal layer 502, for instance a layer of dielectric such as silicon nitride to passivate or protect the metal surface or to provide additional thermal mass for reasons discussed with respect to FIG. 4C.

Bond wires 802 and 804 extend from the metal layer 502 to a heat sink, which in this example is the package substrate 104. In the example shown in FIG. 8, the metal layer 502 is formed covering a majority of or at least a substantial portion of the upper layer 414 of the structure 406. The port 418 in the upper surface 414 therefore also extends through the metal layer 502 to facilitate removal of underlying sacrificial layers. In other embodiments, however, the port 418 may be absent or may be sealed after the sacrificial layers are removed.

In use, the integrated circuitry 116 of the device 800 generates heat, and the amount of heat generated may change due to fluctuations or noise on the power supply voltage level. The structure 406 may contain at least some of the heat within the space 408 and/or within the structure 406. Some of the heat may conduct across parts of the structure, for example across the upper layer 414. The metal layer 502 and bond wires 802 and 804 may conduct at least some of this conducted heat to a heat sink such as the substrate 104. The space 408 defined by the structure 406 may contain air, a vacuum, another gas or any other suitable substance. Two bond wires 802 and 804 are shown, though in other embodiments more or fewer bond wires and/or metal interconnects (i.e. metal connections) may be provided between the metal layer and one or more heat sinks.

In some embodiments of a MEMS device, a bond wire may instead be replaced by a metal interconnect, for example a through-silicon via, between the metal layer 502 and a heat sink. Bond wires and metal interconnects may collectively be referred to as metal connectors.

Figure 10A:
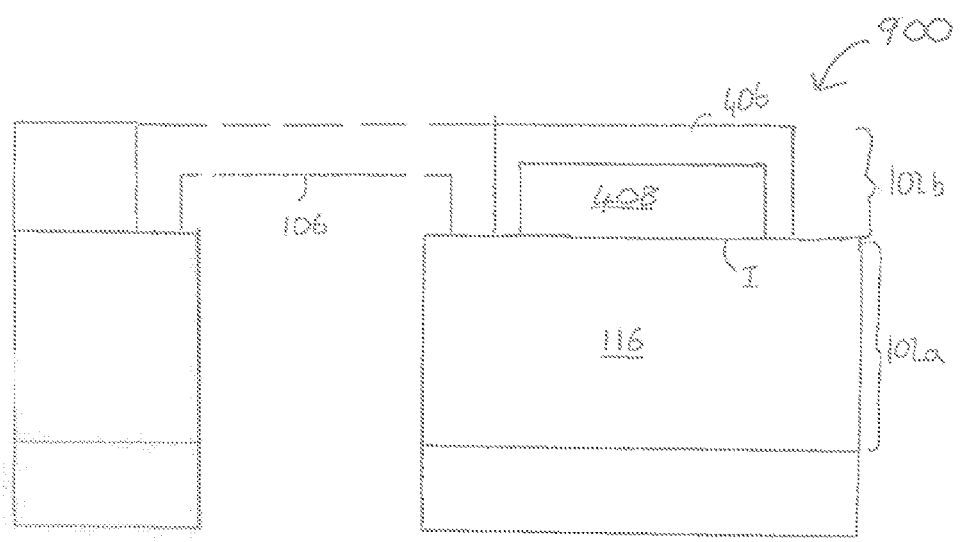
FIGS. 10A-C illustrate cross sections of embodiments of a MEMS device.

FIG. 10A shows a cross-section of an example of a further embodiment of a MEMS device 900. The device 900 comprises a monolithic semiconductor die 102 comprising integrated circuitry 116 provided in a first, circuitry, region of the device and a MEMS transducer comprising a membrane 106 provided in a second, transducer, region of the device. It will be appreciated by those skilled in the art that the semiconductor die may typically comprise a plurality of CMOS diffusions regions and deposition layers which together forms the electronic circuitry. For example, the die may comprise a plurality of CMOS layers 102*a* as well as a plurality of transducer layers which may be formed subsequent to the formation of the CMOS layers and are provided on top of the CMOS layers. It will be appreciated that the integrated circuitry 116 may be formed from one or more of the plurality of CMOS layers. Thus, in this example the integrated circuitry is illustrated as being within the CMOS layers 102*a* of the die.

The device 900 further includes an enclosure which defines a substantially enclosed volume 408. In this example the volume 408 is defined by a structure 406 which is formed above the electronic circuitry or circuitry region of the die. Thus, the structure is provided above the CMOS circuitry such that the volume 408 is substantially enclosed by the structure and by the upper surface I of the top of the die which may be the top layer of the circuitry. It will be appreciated that the uppermost circuitry layer may, in at least one region, form an interface between the circuitry layers 102*a* which form the first region of the device and the transducer layers 102*b* which form the second transducer region of the device. Alternatively or additionally the uppermost layer of circuitry may, in one or more regions, form an upper surface of the semiconductor die. The structure 406 and the volume 408 are arranged to provide a thermal impedance to heat radiating upwardly from the circuitry region. Thus, the volume may be considered to be a thermal resistance volume.

The volume 408 is provided in a plane which overlies the circuitry region such that the volume 408 extends over at least a part of the circuitry region. The volume 408, either alone or in conjunction with the structure 406, inhibits or resists the flow of heat through from the circuitry to the back volume, i.e. the volume of air which acoustically couples the region behind the membrane and the upper surface of the die substrate which overlies the circuitry region.

The space or volume 408 may comprise air, some other gas or may be a vacuum. The space can be considered to be a region devoid of solid material. Alternatively, the space may be provided with solid material having a low thermal conductivity, e.g. a solid material having a lower thermal conductivity than the substrate material. The structure 406 may comprise a lid-type structure.

The volume 408 and the structure 406, can be considered to provide a low pass cut-off frequency for the propagation of heat fluctuations from the circuitry 116 to the volume 212. Thus the flow into the volume 212 of any heat fluctuations of a frequency above this cut off frequency will be attenuated, as desired. In this sense, the structure and associated space defined by the structure can be considered to be a thermal low pass filter. The thermal low pass filter is provided in a plane which overlies at least a part of the circuitry region of the die.

Figure 10B:
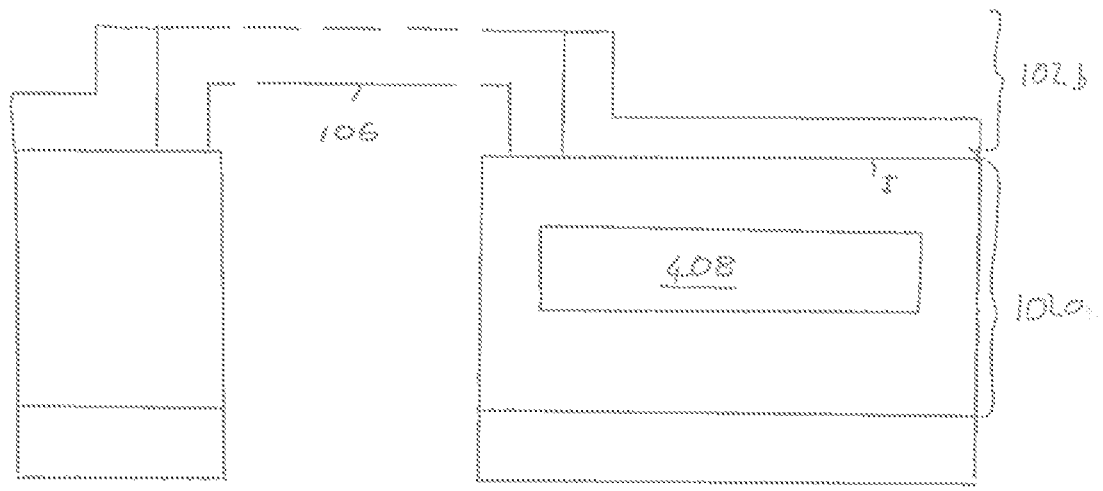

FIG. 10B shows a cross-section of an example of a further embodiment of a MEMS device 900. The device 900 includes a monolithic semiconductor die 102 comprising integrated circuitry (not shown) provided in a first circuitry region 102*a* of the device and a MEMS transducer comprising a membrane 106 provided in a second, transducer region 102*b* of the device. In this example a substantially enclosed volume 408 is defined within the die 102. In particular, the enclosure is formed within the circuitry region 102*a* of the device. The volume may comprise a cavity or region substantially devoid of the material which forms that portion of the die. For example, in arrangements where the die comprises a plurality of CMOS deposition layers, a region comprising one or more CMOS layers may be processed so as to remove the material forming the CMOS layers. Such CMOS deposition layers may be metal and dielectric layers for example. The volume may comprise air, a gas or may be a vacuum. In other example, the volume may be provided with a solid material having a lower thermal conductivity than the material that forms the remainder of the substrate material. The volume provides an increased thermal impedance to heat dissipated from the integrated circuitry formed within the first circuitry region 102*a*.

Figure 10C:
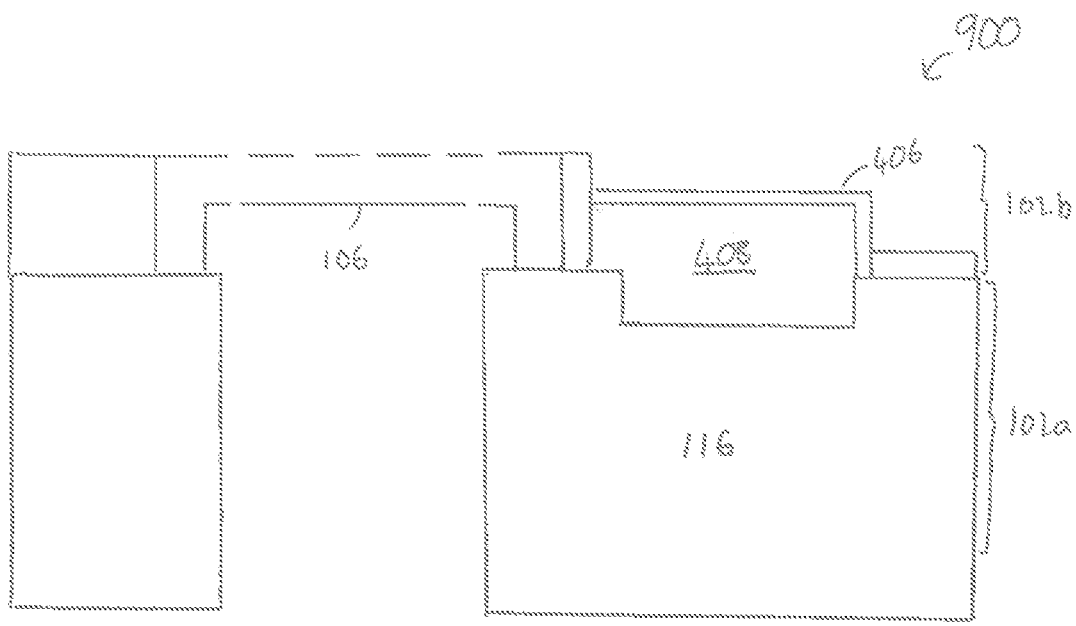

FIG. 10C shows a cross-section of an example of a further embodiment of a MEMS device 900. The device 900 includes a monolithic semiconductor die 102 comprising integrated circuitry 116 provided in a circuitry region 102*a* of the device and a MEMS transducer comprising a membrane 106 provided in a transducer region of the device. In this example a substantially enclosed volume 408 is defined by a structure 406 formed above the circuitry region of the die and additionally by a cavity formed in the upper layer(s) of the die.

In each of the example devices described above, suitable electrical connections may be provided between the electrodes of the membrane and back plate such that the integrated circuitry may measure the capacitance between the electrodes. Therefore, when in use a sound or pressure wave interacts with the membrane 106 and the capacitance between the electrodes changes as a result, the integrated circuitry may detect the capacitance changes as a sound or pressure signal. In some embodiments, the integrated circuitry may perform operations such as filtering, equalisation and/or the like on the sound or pressure signal. The device may also include external connections such that the sound or pressure signal, processed by the integrated circuitry where appropriate, can be obtained from the device and provided to other components of another (e.g., host) device into which the transducer device is incorporated. Such other devices may include, for example, a mobile telephone, tablet computer, laptop computer, microphone, desktop computer, data processing device and the like.

Example devices described above show a transducer co-integrated with integrated circuitry. However, this is not limiting and other embodiments may include a MEMS transducer that is not integrated with the integrated circuit. For example, the transducer and semiconductor die may be formed separately on different wafers or semiconductor substrates. The transducer may be packaged within a package that comprises a package substrate carrying the components and a lid, though other packaging types may be used in other embodiments.

In some embodiments, such as some embodiments described above, a device may include a structure that has side walls and a layer that form a "box" shape. However, this shape is not limiting and other shapes for the structure are envisaged. For example the side walls 404, etc., illustrated as being vertical may be inclined at an angle of say 45 degrees or 60 degrees to the surface of the semiconductor die for mechanical strength or other reasons.

Some embodiments of the structure, particularly those including side walls and a further layer, may be formed in process steps that also form other parts of the device, for example an integrated MEMS transducer, and therefore formation of at least some parts of the structure may not require any additional process steps.

In some embodiments, a metal layer is disposed on a surface (such as a surface of the semiconductor die, a surface of the integrated circuitry or a surface of the structure). In some cases, the metal layer may cover between 50% and 100% of the area of the surface. For example, where a metal layer is disposed on the upper surface of an integrated circuit, the metal layer may cover at least 50% of the upper surface. Alternatively, for example, where a metal layer is disposed on a portion of the structure such as an upper layer, the metal layer covers at least 50% of the surface of the upper portion. In other cases, however, the metal layer may be embedded within the semiconductor die or portion of the structure. In some cases, the metal layer may also be covered by further layers.

For some applications, embodiments will be implemented in which the integrated circuitry is a DSP (Digital Signal Processor), ASIC (Application Specific Integrated Circuit) or FPGA (Field Programmable Gate Array). It should be noted that the above-mentioned embodiments are illustrative rather than limiting embodiments, and that those skilled in the art will be able to design many alternative embodiments without departing from the scope of the appended claims. For example, the embodiments may include more or fewer components as appropriate. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A micro-electro-mechanical system (MEMS) device comprising:
   a semiconductor die including integrated circuitry;
   a structure mounted on the semiconductor die and covering at least a portion of the circuitry, the structure defining a space between the structure and the at least a portion of the circuitry; and
   a transducer including a membrane, the transducer located outside of the space, wherein the MEMS device defines a volume containing the structure and the transducer, and wherein the space thermally insulates the membrane from the at least a portion of the integrated circuitry.

2. The MEMS device of claim 1, wherein the structure includes side walls mounted on the semiconductor die and a first layer, wherein side walls and the first layer define the space.

3. The MEMS device of claim 2, wherein the structure includes at least one additional layer formed on the first layer.

4. The MEMS device of claim 1, wherein the transducer includes a transducer backplate layer adjacent to and spaced apart from the membrane, the transducer backplate layer and the membrane forming a capacitive transducer.

5. The MEMS device of claim 4, wherein the transducer backplate layer and at least part of the structure comprise the same material, comprise a continuous layer, and/or are formed in the same formation step.

6. The MEMS device of claim 4, wherein the structure includes a back layer spaced apart from the at least a portion of the circuitry, and wherein the back layer is thicker than the transducer backplate layer.

7. The MEMS device of claim 1, wherein the transducer is integrated on the semiconductor die.

8. The MEMS device of claim 7, further comprising a second membrane within the space.

9. The MEMS device of claim 8, wherein the membrane and the second membrane comprise the same material, comprise a continuous layer, and/or are formed in the same formation step.

10. The MEMS device of claim 1, further comprising a package that defines a volume that contains the integrated circuitry, the structure and the transducer, the package including at least one port for allowing sound or pressure waves to interact with the membrane.

11. The MEMS device of claim 1, wherein the structure includes at least one hole.

12. The MEMS device of claim 1, wherein the space contains air, a gas, a solid material or a vacuum.

13. The MEMS device of claim 1, wherein at least part of the structure is formed of silicon nitride.

14. A MEMS microphone packaged device comprising:
   a MEMS transducer die comprising a membrane; and
   a second die comprising integrated circuitry operatively coupled to the MEMS transducer, wherein the second die comprises a thermal impedance structure mounted above at least part of the integrated circuitry for reducing the effect of change in temperature of the integrated circuitry on the membrane, and wherein the MEMS microphone packaged device further comprises a lid defining a volume containing the MEMS transducer die and the thermal impedance structure.

15. The MEMS device of claim 14, wherein said space is bounded by said structure so as to be substantially not in acoustic communication with said membrane.

16. A monolithic semiconductor die comprising:
   circuitry provided in a first region of the die;
   a MEMS transducer provided in a second region of the die; and
   an enclosure provided on a thermal flow path between the first region and the second region.

17. A monolithic semiconductor die as claimed in claim 16, wherein the enclosure is provided so as to overlie at least a part of the circuitry.

18. A monolithic semiconductor die as claimed in claim 16, wherein the enclosure is at least partly defined by a structure which is formed above the first region.

19. A monolithic semiconductor die as claimed in claim 16, wherein the enclosure is at least partly defined by a cavity formed within the first region.

20. A monolithic semiconductor die as claimed in claim 16, wherein the enclosure comprises a thermal low pass filter.

* * * * *